United States Patent
DeBusk et al.

[19]

[11] Patent Number: 6,140,187
[45] Date of Patent: Oct. 31, 2000

[54] PROCESS FOR FORMING METAL OXIDE SEMICONDUCTORS INCLUDING AN IN SITU FURNACE GATE STACK WITH VARYING SILICON NITRIDE DEPOSITION RATE

[75] Inventors: Damon K. DeBusk; Gregg S. Higashi; Pradip K. Roy; Nancy Xianghong Zhao, all of Orlando, Fla.

[73] Assignee: Lucent Technologies Inc., Murray Hill, N.J.

[21] Appl. No.: 09/205,414

[22] Filed: Dec. 2, 1998

[51] Int. Cl.[7] .................................................. H01L 21/336
[52] U.S. Cl. .......................... 438/287; 438/216; 438/591; 438/763; 438/954
[58] Field of Search ................................... 438/216, 287, 438/591, 762, 763, 954

[56] References Cited

U.S. PATENT DOCUMENTS

| | | | |
|---|---|---|---|
| 4,737,379 | 4/1988 | Hudgens et al. | 427/575 |
| 4,742,020 | 5/1988 | Roy | 437/61 |
| 5,147,820 | 9/1992 | Chittipeddi et al. | 437/193 |
| 5,298,436 | 3/1994 | Radosevich et al. | 437/29 |
| 5,322,807 | 6/1994 | Chen et al. | 437/40 |
| 5,445,984 | 8/1995 | Hong et al. | 438/261 |
| 5,648,293 | 7/1997 | Hayama et al. | 438/485 |
| 5,668,028 | 9/1997 | Bryant | 438/287 |
| 5,885,889 | 3/1999 | Aisou | 438/592 |

OTHER PUBLICATIONS

"Controlled Nitrogen Incorporation at the Gate Oxide Surface", Hattangady et al., Applied Physics Letters, vol. 66 (25), Jun. 19, 1995, 3495–3497.

Stanley Wolf Ph.D. and Richard N. Tauber Ph.D. in "Silicon Processing for the VLSI Era, vol. 1: Process Technology", Lattice Press, pp. 175–177, 1986.

*Primary Examiner*—Charles Bowers
*Assistant Examiner*—William M. Brewster

[57] ABSTRACT

The present invention provides a process for forming a dopant barrier layer in a gate stack in a semiconductor device. In one advantageous embodiment, the process includes forming a gate oxide on a semiconductor substrate, forming a gate layer on the gate oxide, and forming an ultra thin (less than about 2.5 nm) silicon nitride dopant barrier layer between the gate oxide and the gate layer. The dopant barrier layer provides an excellent barrier to inhibit dopant diffusion through the gate oxide and into the p-channel during the formation of the source/drain areas. Moreover, the formation of this dopant barrier layer and the formation of the gate layer can easily be achieved in a single furnace, if so desired.

15 Claims, 2 Drawing Sheets

PROCESS FOR FORMING METAL OXIDE SEMICONDUCTORS INCLUDING AN IN SITU FURNACE GATE STACK WITH VARYING SILICON NITRIDE DEPOSITION RATE

TECHNICAL FIELD OF THE INVENTION

The present invention is directed, in general, to a device and process for the fabrication of a metal oxide semiconductor (MOS) and, more specifically, to a p-channel MOS (PMOS) device and process for forming, in a single deposition furnace, an in situ PMOS dopant barrier layer between the gate oxide and the gate.

BACKGROUND OF THE INVENTION

As is well known, transistors in semiconductor devices are commonly constructed on silicon wafers using a chemical vapor deposition (CVD) process along with many other process steps. Individual transistor components are fabricated on a wafer using CVD to deposit materials on the wafer that will eventually be etched to define source, drain or gate regions of a transistor. Components are formed over either n-tub or p-tub regions in the silicon substrate. The individual transistor regions are then doped with either an n-type or p-type dopant according to the desired type of semiconductor device.

In p-channel metal oxide semiconductor (PMOS) devices, boron is typically the p+dopant that is implanted into the source/drain regions. However, during this phase of the manufacturing step, heavily doped boron in the polysilicon gate has a tendency to diffuse through the gate oxide layer and into the p-channel areas of the device. This diffusion often leads to severe threshold voltage instablilities and reliability problems in the PMOS device.

One solution to counter the effects of the boron diffusion is to use an oxide-nitride-oxide (ONO) or oxide-nitride (ON) gate dielectric process to prevent boron diffusion. During the ONO or One process, multiple layers of dielectric are processed in separate furnaces and furnace cycles to create a boron diffusion barrier between the p+ doped areas and the p-channel areas of the device. While ONO or ON is an effective solution to boron diffusion, it is a costly process with low throughput. More importantly, ONO or ON dielectrics have severe interface trap problems that cause numerous trap induced device problems, such as short channel effects and transistor instability issues.

Accordingly, what is needed in the art is a single step process to form a very thin nitride layer over the gate dielectric to reduce the diffusion of boron from p+ doped poly or amorphous silicon into p-channel areas of the device without interface trap and mobility problems.

SUMMARY OF THE INVENTION

To address the above-discussed deficiencies of the prior art, the present invention provides a process for forming a dopant barrier layer in a gate stack in a semiconductor device. In one advantageous embodiment, the process includes forming a gate oxide on a semiconductor substrate, forming a gate layer on the gate oxide, and forming an ultra thin (less than about 2.5 nm) silicon nitride dopant barrier layer between the gate oxide and the gate layer. The dopant barrier layer is preferably a single layer of nitride that forms interfaces with gate oxide and the gate layer. The dopant barrier layer provides an excellent barrier to inhibit dopant diffusion through the gate oxide and into the p-channel during the formation of the source/drain areas. Moreover, the formation of this dopant barrier layer and the formation of the gate layer can easily be achieved in a single furnace, if so desired.

In other related embodiments, the process may include forming the dopant barrier layer subsequent to forming the gate layer but just prior to a polysilicon deposition as a process perturbation of a polysilicon or amorphous silicon (poly/αSi) deposition in a single furnace process. Alternatively, the process may include forming the dopant barrier layer concurrently with forming the gate layer as an addition to the gate oxide process, again in a single furnace process.

In another embodiment, the dopant barrier layer includes forming a nitride layer between the gate oxide and the gate layer. This nitride layer is, of course, distinguishable from conventional ONO or ON structures in that this nitride dopant barrier layer is ultrathin (e.g., less than about 2.5 nm) and sufficiently transparent to oxidizing ambient for annealing out the interface traps at the silicon nitride/silicon dioxide interface, which often occur. Furthermore, because the nitride layer can be formed in a single furnace, the problems associated with the multi-furnace processes are abated.

In one aspect of the present invention, the nitride layer may be formed just prior to a poly/αSi deposition in a low pressure chemical vapor deposition (LPCVD) furnace by reacting ammonia with silane ($SiH_4$) or dichlorosilane ($SiH_2Cl_2$) onto the gate oxide followed immediately by conventional LPCVD poly/αSi by shutting of the ammonia and pyrolising the silane typically above 575° C. for polysilicon and below 550° C. for amorphous silicon deposition.

In another aspect of this embodiment, this ultrathin nitride layer can be formed as an integral part of the gate oxidation process rather than the poly/αSi process. In this case, immediately following gate oxidation, the top gate oxide layer can be subjected to a low temperature (e.g., from about 100° C. to about 300° C.) nitridation with a remote helium/argon and nitrogen/ammonia plasma discharge. The use of remote plasma avoids gate oxide damage and controls the nitrogen concentration to form an ultrathin nitride that is transparent to oxidant during the step of annealing out the traps.

In yet another embodiment, the process includes forming the gate oxide, forming the gate layer, and forming the dopant barrier layer over an n-tub of a PMOS device.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
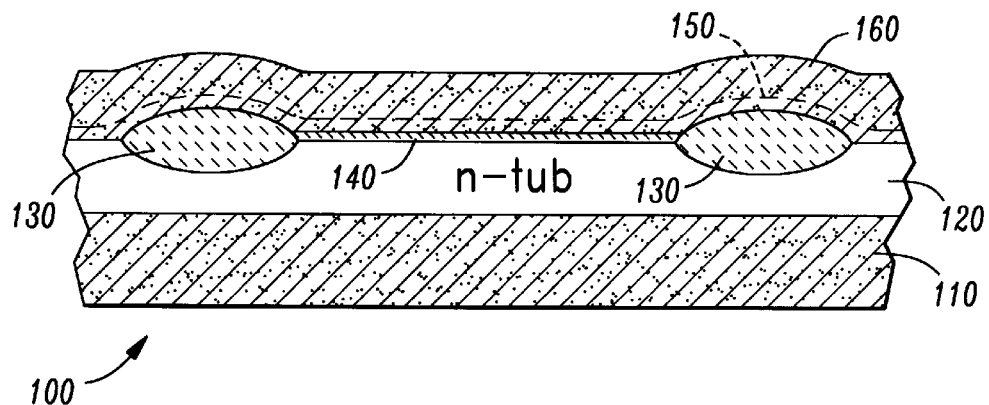
FIG. 1 illustrates a sectional view of an improved p-channel MOS device constructed according to principles of the present invention at an intermediate stage of manufacture.

Referring initially to FIG. 1, illustrated is a sectional view of an improved p-channel MOS device constructed according to principles of the present invention at an intermediate stage of manufacture. At this stage, an improved p-channel MOS device, generally designated 100, comprises a silicon substrate 110, an n-tub region 120, field oxide regions 130, a gate oxide layer 140, a nitride barrier layer 150, and a poly/αSi gate layer 160. The silicon substrate 110, n-tub region 120, field oxide regions 130, and gate oxide layer 140 are formed by conventional processes. In one embodiment, a nitride barrier layer 150 is formed during the deposition of the poly/αSi gate layer. Typically, the gate layer is formed by a conventional poly/αSi deposition process. The nitride barrier layer 150 may be formed as a part of the poly/αSi deposition process schedule to provide a ultrathin silicon nitride ($Si_3N_4$) layer by reacting ammonia ($NH_3$) with $SiH_4$ or $SiH_2Cl_2$ in a ratio ranging from about 1:1 to about 10:1 at less than about 500 milliTorr and at a temperature ranging from about 750° C. to about 800° C. After deposition of about 1 nm to about 2.5 nm of the nitride layer, the furnace temperature can be reduced to a temperature ranging from about 600° C. to about 670° C. for polysilicon or below 575° C. (e.g., 550° C.) for amorphous silicon deposition while pumping the process tube to a base pressure of about 6 milliTorr, followed by a nitrogen purge for about 15 to 20 minutes. The gate layer 160 is then formed insitu in the same polysilicon LPCVD reactor where the barrier layer 150 has just been deposited.

The desired effect of preventing penetration of boron p+ ions may be achieved with a very thin layer of nitride, e.g., having a thickness ranging from about 0.5 nm to about 2.0 nm. When the desired thickness of nitride has been achieved, the deposition of polycrystalline silicon may proceed by eliminating the $NH_3$ component of the gas mixture. Thus, the nitride layer 150 may be formed in the same furnace environment as is required for the deposition of the polycrystalline silicon gate layer 160. In one aspect of the present invention, the nitride layer 150 may be deemed to be formed prior to the deposition of the gate layer 160. In another aspect, the nitride layer 150 may be formed concurrently with the deposition of the gate layer 160 in that the nitride layer 150 is formed in situ, differing principally from the gate layer 160 deposition by the presence of $NH_3$ in the gas mixture, as discussed above.

In an alternative embodiment, however, the nitride barrier layer 150 may be formed immediately following the gate oxidation process as a simple perturbation to the gate oxidation process. This particular procedure includes nitriding a traditionally grown thermal oxide with a remote, high density, helium base nitrogen discharge. In an advantageous embodiment, the helium-nitrogen plasma discharge is conducted at a temperature ranging from about 100° C. to about 300° C. for a short duration (e.g., from about 5 to 25 seconds) and at a pressure below 0.1 torr. At these conditions, top surface selective nitridation occurs. The use of a remote discharge isolate the wafer from any plasma damage. This advantageous process also entails better nitrogen concentration control and compatability with conventional oxidation process for easy integration. The resulting nitride dopant barrier layer 150 is typically less than about 1.5 nm thick and has sufficient boron penetration suppressor capabilities and is semitransparent for oxygen diffusion during the annealing out of the traps. As such, the midgap interface trap density ($D_{it}$) and channel mobility degradation are minimized by the process of the present invention. After nitriding the top surface, in another embodiment, an oxidizing anneal may be conducted at a temperature of about 800° C.

Thus, the present invention in an alternative embodiment, provides a process whereby the gate layer 160 may be formed at a lower temperature than that described for polysilicon, by depositing amorphous silicon at a temperature below about 570° C. In this particular embodiment, the gate layer 160 may be multiple layers of amorphous silicon formed by varying the deposition rate. This variation in deposition rate forms a polycrystalline silicon layer with a more uniform grain size after the gate layer 160 is annealed at a higher temperature. A typical oscillation in deposition rate may range from about 1 nm/min, to about 1.5 nm/min. to about 3 nm/min. to about 5 nm/min. Alternatively, amorphous silicon may be deposited at varying deposition rates similar to those used for the polysilicon deposition.

Figure 2:
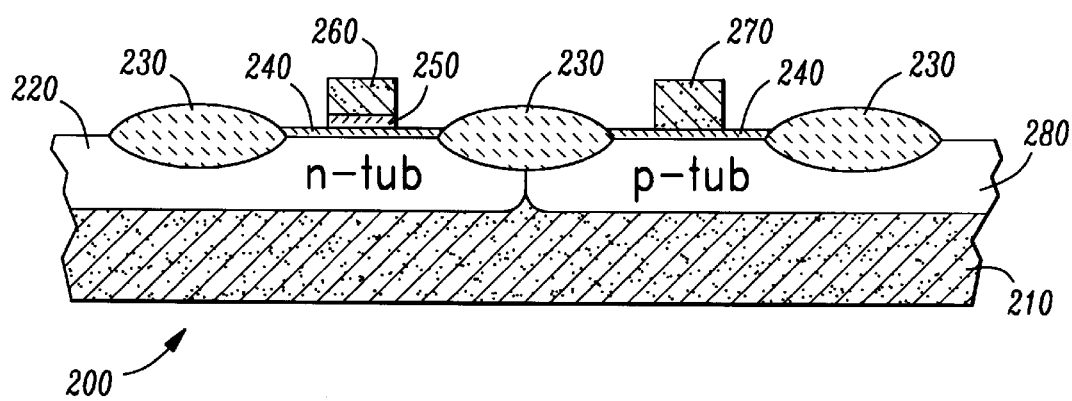
FIG. 2 illustrates a sectional view of one embodiment of a CMOS device constructed according to principles of the present invention at an intermediate stage of manufacture.

Referring now to FIG. 2, illustrated is a sectional view of one embodiment of a CMOS device constructed according to principles of the present invention at an intermediate stage of manufacture. A CMOS device, generally designated 200, comprises a silicon substrate 210, an n-tub region 220, field oxide regions 230, a gate oxide layer 240, a dopant barrier layer or nitride layer 250, silicon gates 260, 270, and p-tub region 280. The gate 260 is located over the n-tub region 220, which forms a PMOS device, and the other gate 270 is located over the p-tub region 280, which forms an NMOS device. The gates 260, 270 are formed on the gate oxide layer 240 using conventional methods of masking and etching necessary to remove excess material from the gates 260, 270. The illustration depicts the device prior to dopant implantation.

The gate 260 located over the n-tub region 220 has been formed with the dopant barrier layer 250 to prevent dopant diffusion into the area of the n-tub region 220 below the gate 260. However, the dopant barrier layer 250 is not present in the gate 270 located over the p-tub region 280. The absence is because the physical and electrical characteristics of the NMOS device do not necessitate preventing p+ boron dopant diffusion.

Figure 3:
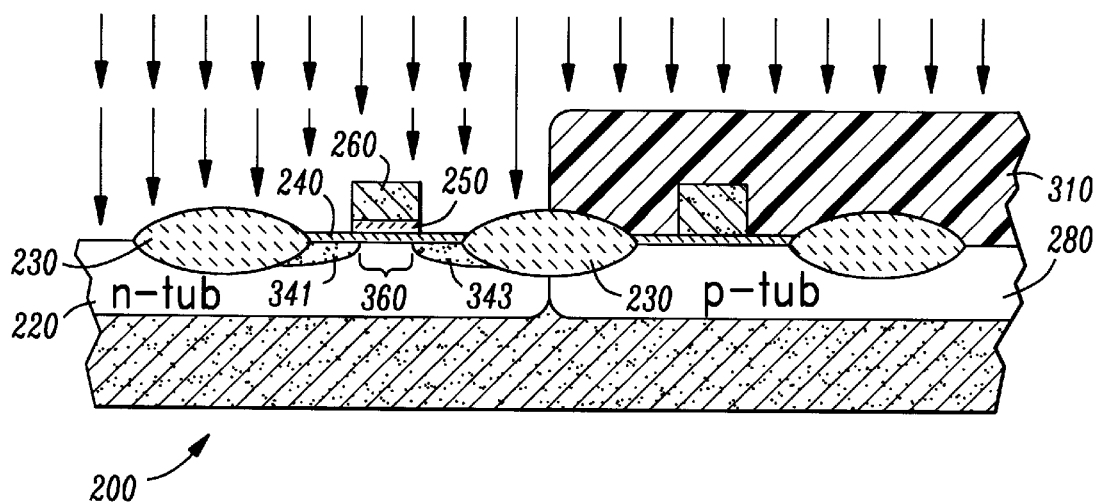
FIG. 3 illustrates a sectional view of the semiconductor device of FIG. 2 after the implantation of dopant to the n-tub region.

Referring now to FIG. 3, illustrated is a sectional view of the semiconductor device of FIG. 2 during the implantation of a dopant to the n-tub region. A photo resist mask 310 has been applied over the p-tub region 280 to prevent unwanted dopant contamination during the formation of source and drain regions in the n-tub region 220. Boron p+ dopant is applied to the semiconductor device 200 by conventional CVD or ion implantation methods and diffuses through the gate oxide layer 240 to form a source 341 and a drain 343. Dopant consequently also diffuses into the gate 260. However, the dopant barrier layer 250 prevents the dopant from diffusing through the gate 260 and into a p-channel area 360 of the semiconductor device 200. Without the dopant barrier layer 250, the likelihood that dopant would diffuse into the p-channel area 360 of the device 200 and result in punchthrough is increased. However, with the dopant barrier layer in place, punchthrough is substantially decreased, if not eliminated entirely. The dopant barrier layer 250, in an advantageous embodiment is a nitride, however, other embodiments, may include any other material that is known to those who are skilled in the art and that inhibits dopant diffusion from the gate layer into the p-channel areas 360 of the device.

Figure 4:
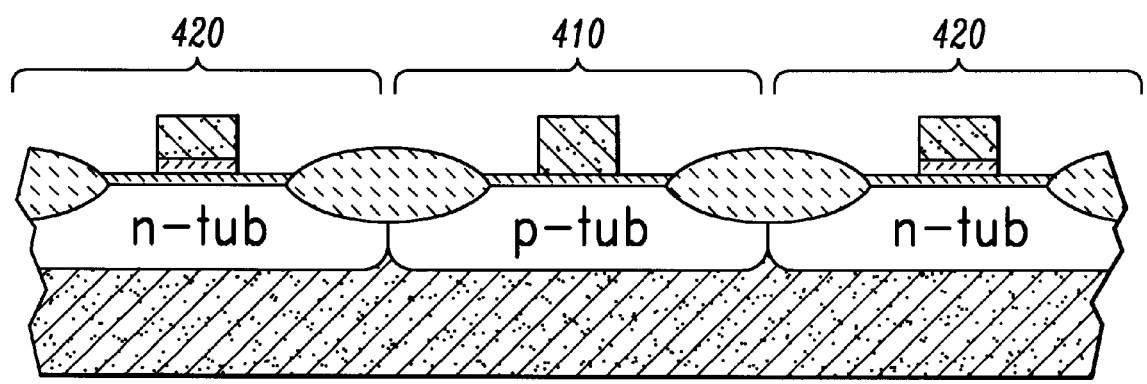
FIG. 4 illustrates a sectional view of a CMOS device comprising both NMOS and PMOS devices.

Referring now to FIG. 4, illustrated is a sectional view of a CMOS device comprising a plurality of both NMOS 410 and PMOS 420 devices. This particular figure simply illustrates that the present invention can be used to form a dopant barrier layer in a plurality of PMOS devices simultaneously by conventional masking and doping processes.

Although the present invention has been described in detail, those skilled in the art should understand that they can make various changes, substitutions and alterations herein without departing from the spirit and scope of the invention in its broadest form.

What is claimed is:

1. A process for forming a dopant barrier in a gate stack in a semiconductor device, comprising:

forming a gate oxide on a semiconductor substrate;

forming a silicon gate layer on said gate oxide by using a low temperature and varying a deposition rate of said gate layer during said deposition; and forming a dopant barrier layer between said gate oxide and said gate layer including nitriding a top surface of said gate oxide.

2. The process as recited in claim 1 wherein forming said dopant barrier layer includes said nitriding a top surface of said gate oxide at a temperature ranging from about 100° C. to about 300° C. and using a remote helium/argon and nitrogen/ammonia plasma discharge followed by an oxidizing anneal conducted at a temperature of about 800° C.

3. The process as recited in claim 2 wherein forming said dopant barrier layer includes forming said dopant barrier layer to a thickness ranging from about 0.5 nm to about 2.0 nm.

4. The process as recited in claim 1 wherein forming said dopant barrier layer includes forming a single nitride layer between said gate oxide and said gate layer.

5. The process as recited in claim 1 wherein said dopant barrier layer and said gate layer are formed in a single deposition device.

6. The process as recited in claim 1 wherein forming a gate layer includes depositing a polysilicon material on said dopant barrier layer.

7. The process as recited in claim 1 wherein varying a deposition rate includes depositing an amorphous silicon at a rate ranging from about 1 nm to 1.5 nm per minute to about 3 nm to 5 nm per minute.

8. The process as recited in claim 1 wherein forming a gate oxide, forming a gate layer, and forming a dopant barrier layer includes forming a gate oxide, forming a gate layer, and forming a dopant barrier layer over an n-tub of a PMOS device.

9. A process for fabricating a semiconductor device, comprising:

forming a tub region in a semiconductor substrate;

forming a gate oxide on said semiconductor substrate over said tub region;

forming a silicon gate layer on said gate oxide by using a low temperature and varying a deposition rate of said gate layer during said deposition; and forming a dopant barrier layer between said gate oxide and said gate layer including nitriding a top surface of said gate oxide; and forming source/drain regions in said tub region adjacent said gate oxide.

10. The process as recited in claim 9 wherein forming said dopant barrier layer includes forming a single nitride layer between said gate oxide and said gate layer such that said nitride layer forms interfaces with said gate oxide and said gate layer.

11. The process as recited in claim 9 wherein forming said dopant barrier layer includes nitriding a top surface of said gate oxide at a temperature ranging from about 100° C. to about 300° C. and using a remote helium/argon and nitrogen/ammonia plasma discharge followed by an oxidizing anneal conducted at a temperature of about 800° C.

12. The process as recited in claim 9 wherein forming a gate layer includes depositing a polysilicon material on said dopant barrier layer.

13. The process as recited in claim 9 wherein forming a gate layer includes depositing an amorphous silicon on said gate oxide.

14. The process as recited in claim 9 wherein varying a deposition rate includes depositing said amorphous silicon at a rate ranging from about 1 nm to 1.5 nm per minute to about 3 nm to 5 nm per minute.

15. The process as recited in claim 9 further including forming a plurality of n-tub regions, gate oxides, gate layers, dopant barrier layers, and p-type source/drain regions to form a plurality of PMOS transistors in a complementary metal oxide semiconductor (CMOS) device.

* * * * *